(12) United States Patent
Ghislotti et al.

(10) Patent No.: US 6,618,194 B1
(45) Date of Patent: Sep. 9, 2003

(54) OPTICAL AMPLIFIER WITH TWO DIRECTIONAL PUMPING

(75) Inventors: Giorgio Ghislotti, Montevecchia (IT); Stefano Balsamo, Cairo Montenotte (IT); Salvatore Morasca, Como (IT); Alberto Ferrari, Menconico (IT)

(73) Assignee: Corning O.T.I. SpA, Milan (IT)

( * ) Notice: Subject to any disclaimer, the term of this patent is extended or adjusted under 35 U.S.C. 154(b) by 0 days.

(21) Appl. No.: 10/091,094

(22) Filed: Mar. 4, 2002

(51) Int. Cl.$^7$ .................................................. H01S 3/00
(52) U.S. Cl. ................................. 359/341.3; 359/341.33
(58) Field of Search ........................... 359/341.3, 341.33

(56) References Cited

U.S. PATENT DOCUMENTS

| | | | | |
|---|---|---|---|---|
| 5,640,268 A | * | 6/1997 | Chesnoy | 359/341 |
| 5,995,275 A | * | 11/1999 | Sugaya | 359/341 |
| 6,038,061 A | * | 3/2000 | Sugaya | 359/337 |
| 2002/0089738 A1 | * | 7/2002 | Kanda | 359/341.3 |

FOREIGN PATENT DOCUMENTS

| | | | |
|---|---|---|---|
| EP | 1 170 838 A1 | * | 1/2002 |
| JP | 405063270 A | * | 3/1993 |

* cited by examiner

Primary Examiner—Mark Hellner
(74) Attorney, Agent, or Firm—Svetlana Z. Short

(57) ABSTRACT

A bidirectionally pumped optical amplifier (200) comprises an active fibre (201), a first WDM coupler (204) and a second WDM coupler (205), a first pump branch (220) coupled to said first WDM coupler (204) comprising a first laser (202) and a first grating (210), for introducing pump radiation into said active fibre (201) in a first direction, a second pump branch (230) coupled to said second WDM coupler (205) comprising a second laser (203) and a second grating (212), for introducing pump radiation into said active fibre (201) in a second direction, opposite to said first direction. The second laser has an output power $P_F$. A first pump residual, having a power $P_{inj}$, is coupled into said second pump branch (230) from the active fibre (201) and injected into said second laser (203). The first pump branch (220) further comprises an optical isolator (211) for the pump radiation. The output power of the injected laser and the injected pump power residual are such that $P_F/P_{inj} > 2$.

20 Claims, 11 Drawing Sheets

OPTICAL AMPLIFIER WITH TWO DIRECTIONAL PUMPING

The present invention relates to a bidirectionally pumped optical amplifier and to a method for bidirectionally pumping an optical amplifier. The present invention also relates to a method for stabilizing the optical emission of a laser module including a selective reflector injected by an external radiation.

BACKGROUND OF THE INVENTION

FIG. 1 shows a configuration of a known bidirectionally pumped optical fibre amplifier 100, comprising an amplifying doped optical fibre section 101, for example an erbium doped amplifying fibre, pump lasers 102, 103, WDM couplers 104, 105, optical isolators 106, 107 for light signals, input and output terminals 108, 109. An optical signal is launched in the amplifier 100 through the input terminal 108, travels along the doped fibre section 101 to be amplified therein and exits through the output terminal 109. Suitable energy for amplification is provided by pump lasers 102, 103, which couple pump light to the doped fibre 101 through WDM couplers 104, 105. In particular, pump light from laser 102 is launched co-directionally in the doped fibre 101, that is in the same direction of the optical signal, whereas pump light from laser 103 is launched counter-directionally, that is, in the opposite direction with respect to the optical signal. For an erbium doped fibre amplifier, pump lasers 102, 103 may emit light whose wavelength is comprised, for example, in a pumping band centered around 980 nm or 1480 nm.

Herein and in the following of the description, the expressions "co-directionally", "counter-directionally", "co-propagating", "counter-propagating" will be always referred to the propagation direction of the optical signal.

The configuration shown in FIG. 1 has a problem in that the residual pump light frown each pump laser, not fully absorbed by the amplifying fibre, is injected into the opposite pump laser, which can result in optical instabilities in the emission of the latter and in fluctuations in amplification of the optical signal.

It is known that such instability can be avoided by placing an isolator on the optical path of each of the pumps.

In U.S. Pat. No. 5,640,268 to Alcatel N.V. a further solution is addressed to this problem. According to '268 patent, each pump injection fibre includes a photorefractive pump filter constituting part of the resonant cavity of the associated pump laser, the two pump filters being mutually different to give rise to an offset between the two pumping bands. The two pumping bands are preferably offset by several nanometers. The pump filters are photorefractive gratings having a determined pitch and thus a determined central wavelength for reflection: according to the '268 patent, the use of such a grating makes it possible simultaneously to reduce the width of the pumping band and to position said band more accurately within the spectrum.

Applicant has experimentally verified that in a configuration according to the '268 patent, if the wavelength emitted by the pump lasers is within the 980 nm pumping band, the offset between the two pumping bands should be greater than 15 nm in order to avoid instabilities due to residual pump injection. Since for an erbium doped fibre amplifier, the pumping band centered around 980 nm is only 10–15 nm wide, an offset between the two photorefractive filters of 15 nm or more would lead one of the pump wavelenghts to be nearly out of the pumping band of erbium, considerably reducing the bidirectional pumping efficiency.

SUMMARY OF THE INVENTION

Applicant has found that it is possible to avoid instabilities in an optical amplifier bidirectionally pumped by 980 pump lasers, each being stabilized by a respective grating, by using one isolator on the output optical path of one of the two pump lasers and by keeping the output power of the second laser sufficiently higher than the residual injected pump. This allows to use only one isolator for the pump light in the bidirectionally pumped amplifier. A simple feedback apparatus may control the power of the residual pump and the output power of the pump laser with no isolator, in order to maintain the correct operative range.

In a first aspect, the invention relates to a bidirectionally pumped optical amplifier comprising an active fibre having two ends, a first WDM coupler and a second WDM coupler coupled to said ends, a first pump branch coupled to the first WDM coupler comprising a first laser and a first selective reflector, for introducing pump radiation into the active fibre in a first direction, a second pump branch coupled to the second WDM coupler comprising a second laser and a second selective reflector, for introducing pump radiation into the active fibre in a second direction, opposite to the first direction, the second laser being adapted for emitting an output power $P_F$, the amplifier being adapted for coupling a pump residual, having a power $P_{inj}$, from the active fibre into the second laser, characterized in that the ratio $P_F/P_{inj}$ is higher than two and the first pump branch further comprises an optical isolator for the pump radiation.

Preferably $P_F/P_{inj}$ should be higher than five, more preferably higher than ten, even more preferably higher than 20.

In preferred embodiments, being $\lambda_1$ the center wavelength of the first selective reflector and $\lambda_2$ the center wavelength of the second selective reflector, $|\lambda_2-\lambda_1|$ is lower than or equal to 15 nm. Preferably, $|\lambda_2-\lambda_1|$ should be higher than 5 nm, more preferably higher than 7 nm.

Preferably, being $g(\lambda)$ the gain curve of the second laser, the difference $g(\lambda_2)-g(\lambda_1)$ should be higher than 0 cm$^{-1}$, more preferably higher than 3 cm$^{-1}$, even more preferably higher than 5 cm$^{-1}$.

Advantageously, $\lambda_1$ and $\lambda_2$ are comprised in a range between 971 nm and 986 nm.

Typically, the active fibre is an erbium doped fibre. Typically, the amplifier further comprises at least one optical isolator for an optical signal. Preferably, the first and second lasers are semiconductor lasers.

In a preferred embodiment, an optical amplifier comprises a pre-amplifying section, including at least one active fibre and at least one pump laser, and a booster section, including a bidirectionally pumped optical amplifier according to the first aspect of the invention.

Advantageously, an optical amplifier comprising a bidirectionally pumped optical amplifier according to the first aspect of the invention may be included along the optical transmission path of an optical transmission system comprising at least one transmitter and at least one receiver, coupled to the optical transmission path. Preferably, the optical transmission system is a WDM system.

In a second aspect, the invention relates to a method for pumping an optical amplifier comprising an active fibre, a first pump laser and a second pump laser, the method comprising:

coupling a first wavelength-stabilized pump radiation from the first pump laser to the active fibre in a first direction;

coupling a second wavelength-stabilized pump radiation from the second pump laser to the active fibre in a second direction, opposite to said first direction, the second pump radiation having a power $P_F$;

coupling a pump residual in the first direction from the active fibre towards the second pump laser, the first pump residual having a power $P_{inj}$;

maintaining the ratio $P_F/P_{inj}$ higher than two, and blocking a pump residual in the second direction from the active fibre before the first pump laser.

Preferably, the ratio $P_F/P_{inj}$ should be maintained higher than five, more preferably higher than ten, even more preferably higher than twenty.

In preferred embodiments, being $\lambda_1$ the wavelength of the first wavelength-stabilized pump radiation and $\lambda_2$ the wavelength of the second wavelength-stabilized pump radiation $|\lambda_2-\lambda_1|$ is lower than or equal to 15 nm. Preferably, $|\lambda_2-\lambda_1|$ should be higher than 5 nm, more preferably higher than 7 nm.

Preferably, being $g(\lambda)$ the gain curve of the second laser, the difference $g(\lambda_2)-g(\lambda_1)$ should be higher than 0 cm$^{-1}$, more preferably higher than 3 cm$^{-1}$, even more preferably higher than 5 cm$^{-1}$.

Advantageously, $\lambda_1$ and $\lambda_2$ are comprised in a range between 971 nm, and 986 nm.

In a third aspect, the invention relates to a method for stabilizing the optical emission of a laser module injected by an external radiation having a wavelength $\lambda_1$, the laser module including a laser and a selective reflector, the laser having a gain curve $g(\lambda)$, the method comprising:

choosing a center wavelength $\lambda_2$ of the selective reflector so that $g(\lambda_2)-g(\lambda_1)>0$ cm$^{-1}$, and maintaining a ratio between an output power $P_F$ of the laser module and a power $P_{inj}$ of the external radiation higher than two.

In preferred embodiments, $|\lambda_2-\lambda_1|$ is lower or equal to 15 nm.

Preferably, the ratio $P_F/P_{inj}$ should be maintained higher than five, more preferably higher than ten, even more preferably higher than twenty.

Preferably, the center wavelength $\lambda_2$ should be chosen so that $g(\lambda_2)-g(\lambda_1)>3$ cm$^{-1}$, more preferably so that $g(\lambda_2)-g(\lambda_1)>5$ cm$^{-1}$.

Advantageously $\lambda_1$ and $\lambda_2$ are comprised in a range between 971 nm and 986 nm.

BRIEF DESCRIPTION OF THE DRAWINGS

There follows a detailed description of how the present invention can be implemented, the description being given by way of non-limiting example and With reference to the accompanying figures, in which.

DETAILED DESCRIPTION OF THE INVENTION

Figure 1:
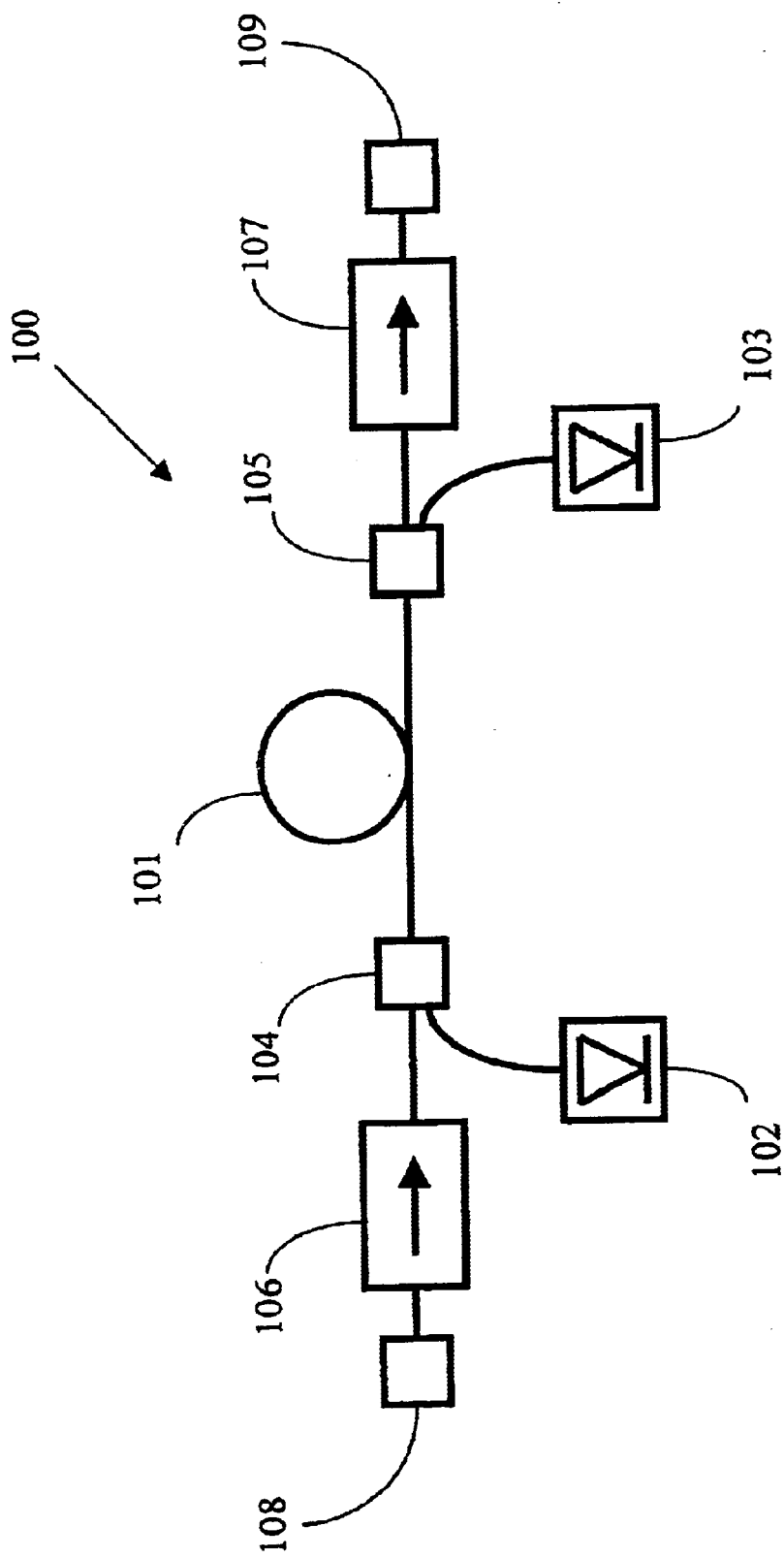
FIG. 1 diagrammatically shows a bidirectionally pumped optical amplifier according to the prior art, already described.

In Erbium Doped Fibre Amplifiers (EDFAs) bidirectional pumping can result into a very efficient amplification of light signals. For example, FIG. 2 shows an embodiment of an optical amplifier 10 comprising a pre-amplifying section 11 and a booster section 12, comprised between an input terminal 13 and an output terminal 14, the two sections 11, 12 being separated by an ASE filter 15.

The pre-amplifier section 11 is a double stage optical amplifier, comprising two erbium doped fibres (EDFs) 111, 111', separated by an isolator 112; pump light is furnished to the EDFs through WDM couplers 115, 116, respectively by pump lasers 113, 114.

The booster section 12 is a bidirectionally pumped optical amplifier, comprising an EDF 121 pumped co- and counter-directionally by two pump lasers 122, 123, through WDM couplers 124, 125 respectively.

Figure 2:
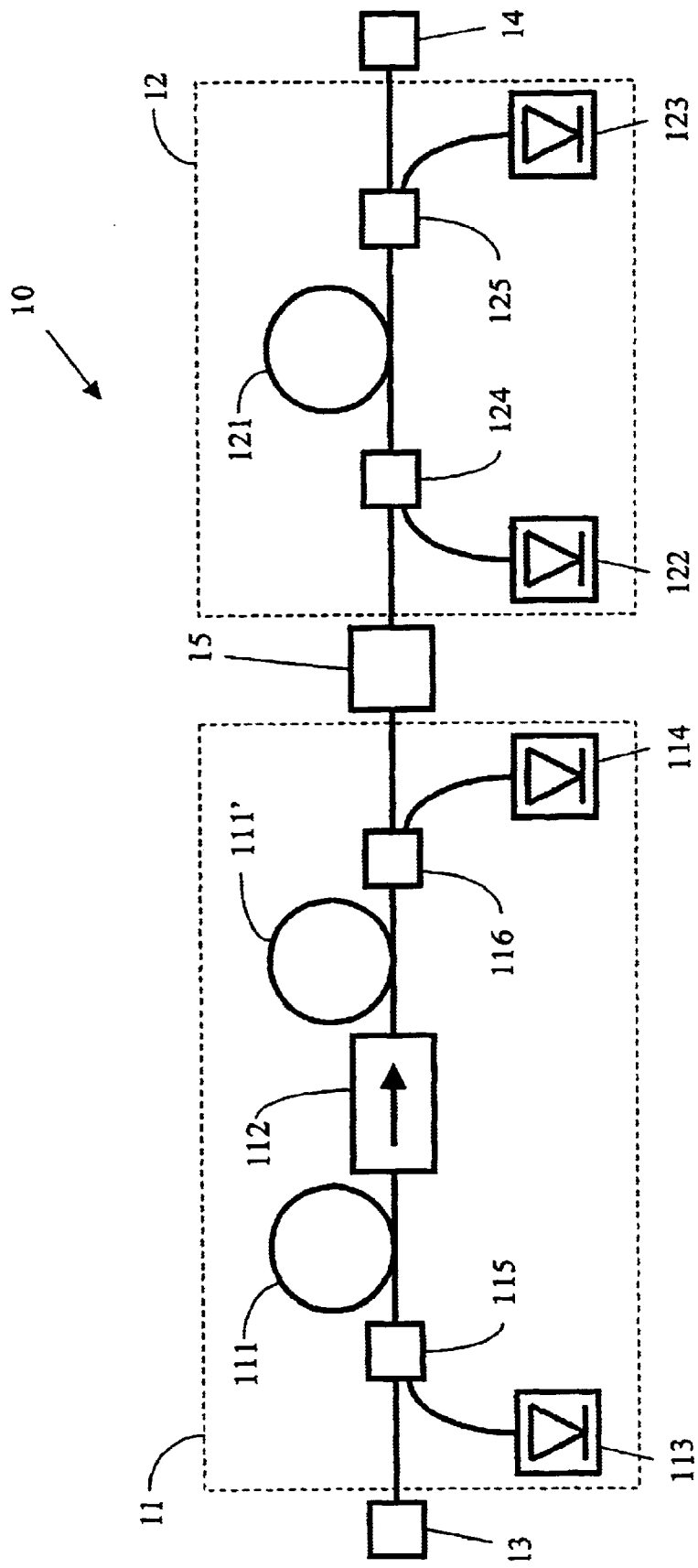
FIG. 2 diagrammatically shows an example of optical amplifier comprising a bidirectionally pumped optical amplifier.

The skilled in the art readily appreciates that the configuration of FIG. 2 is only exemplary, and other configurations of amplifiers may exploit a bidirectionally pumped section.

In an experiment simulated by the Applicant with a setup according to FIG. 2, lasers 113, 114 were 980 nm pump lasers. Two signal channels in the 1550 nm band having total power of –12 dBm were inserted through the input terminal 13, amplified to reach a power level of 9.5 dBm after the first EDF 111 and a power level of 12.7 dBm after the second EDF 111'. The wavelengths of the channels were 1545 nm and 1558 nm. In a first test, pump lasers 122, 123 in the wavelength range around 980 nm were used for the booster section; in a second test, pump lasers 122, 123 in the wavelength range around 1480 nm were used; in a third test, only one laser 122, generating co-propagating pump light in the wavelength range of 980 nm was used. The absorption coefficient of the EDF 121 was about 5 dB/m for a wavelength around 1550 nm. The length of the EDF 121 was 10 m.

For all these tests, the total power ($P_{tot}$) and the power-per-channel ($P_{1545}$, $P_{1558}$) were evaluated at the output terminal 14, together with the signal-to-noise ratio (SNR). Results are reported in the following table 1. For convenience, laser 122, generating copropagating pump light, is indicated as $P_1$; laser 123, generating counter-propagating pump light, is indicated as $P_2$.

TABLE 1

| $P_1, \lambda$ (nm) | $P_1,$ power (mW) | $P_2, \lambda$ (nm) | $P_2,$ power (mW) | $P_{tot}$ (dBm) | SNR (dB) | $P_{1545}$ (dBm) | $P_{1558}$ (dBm) |
|---|---|---|---|---|---|---|---|
| 980 | 150 | 980 | 150 | 22.90 | 36.17 | 19.84 | 19.94 |
| 1480 | 150 | 1480 | 150 | 19.26 | 36.28 | 15.70 | 16.70 |
| 980 | 300 | — | — | 19.93 | 36.17 | 16.50 | 17.30 |

As it can be seen from table 1, a configuration with co- and counter-propagating pump light allows to obtain a higher output power with respect to a configuration with only a co-propagating pump light. Further, bidirectional pumping is more effective at 980 nm than at 1480 nm. Table 1 clearly shows that bidirectional pumping at 980 nm is advantageous also in terms of SNR and, significantly, in terms of flatness of the gain curve. In order to evaluate flatness, the difference between $P_{1545}$ and $P_{1558}$ was considered.

Thus, a result of the experiment above described is that it is desirable to obtain an optically stable bidirectional pumping configuration at 980 nm for an EDFA.

In the 980 nm pumping band, which is often referred in the literature as "980 nm window", the absorption band of the EDF is 10–15 nm wide (from about 971 nm to about 986 nm), whereas the gain spectrum of a 980 nm semiconductor pump laser is typically 60 nm. Thus, in a bidirectional pumping scheme, unabsorbed residual pump from one laser can be injected in the other laser, inducing instabilities in the optical emission of the latter. Applicant has found that the sole use of gratings for reducing the emission bandwidth of the lasers may be not sufficient for avoiding such optical instabilities if the difference $|\Delta\lambda|$ between the center wavelengths is lower than 15 nm, which is actually the width of the 980 nm window.

Figure 3:
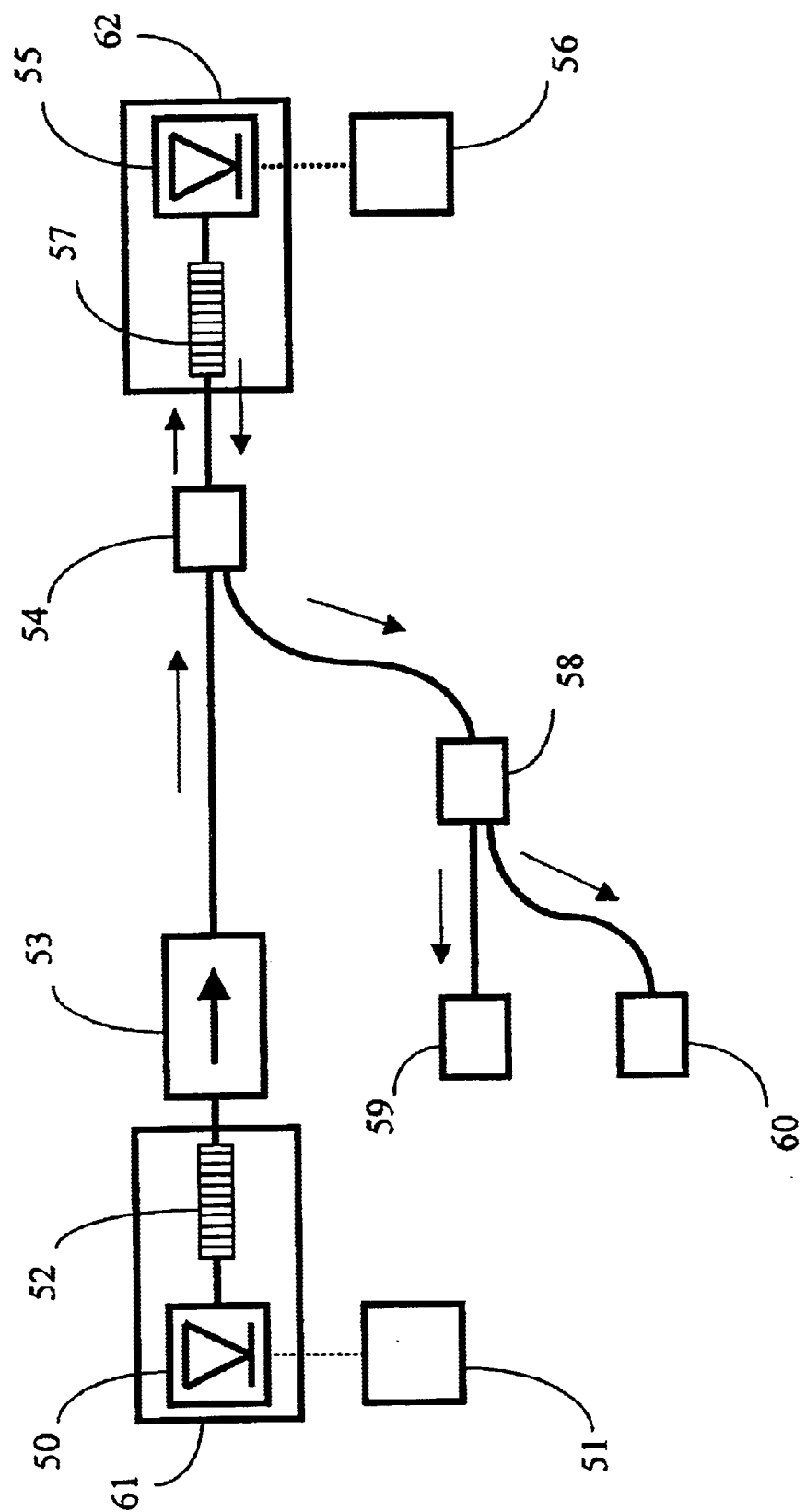
FIG. 3 diagrammatically shows an experimental setup for studying instability induced by the residual pump.

Applicant has studied this kind of instability using the experimental setup schematically shown in FIG. 3. For convenience, optical connections (realized by single mode optical fibres) are shown by solid lines in FIG. 3, whereas electrical connections are shown by dotted lines. A first semiconductor laser 50 emitting in a band around 980 nm, associated with respective temperature and current control circuits 51, was connected to a first stabilizing fibre grating 52 and then to an isolator 53 for the 980 nm wavelength. The output of the isolator 53 was then connected to a first port of a first 2×1 single mode fibre coupler 54 for light of 980 nm. A second semiconductor laser 55 emitting in a band around 980 nm, associated with respective temperature and current control circuits 56, was connected to a second stabilizing fibre grating 57 and then to a second port of the 2×1 fibre coupler 54. A power meter 59 and an optical spectrum analyzer 60 were connected to two ports of a second 2×1 single mode fibre coupler 58 for 980 nm while a third port of the second 2×1 fibre coupler 58 was connected to a third port of the first 2×1 fibre coupler 54, in order to measure optical emission (total power and spectrum) from the second laser 55. In the following, we will generally refer to a laser optically connected to a grating to as a "laser+grating module". In FIG. 3, rectangles refer to a first laser+grating module 61, enclosing first laser 50 and first grating 52, and to a second laser+grating module 62, enclosing second laser 55 and second grating 57.

The first fibre grating 52 was set for stabilizing the emission of the first laser 50 in a bandwidth of about 0.5 nm around 977 nm. The second fibre grating 57 was set for stabilizing the emission of the second laser 55 in a bandwidth of about 0.5 nm around 975 nm. The gratings 52, 57 were low reflectivity gratings having a reflectivity of about 5%. The power ratio in the arms of the first and second 2×1 fibre couplers 54, 58 was 80/20.

Lasers 50, 55 used for the experiment were E2 pump modules for terrestrial applications, produced by 4the Applicant. Optical isolator 53 was a 980 nm optical isolator, produced by Tokin, having an insertion loss of 1.2 dB and an extinction ratio of 30 dB.

In operation, emission from first laser+grating module 61 is stabilized in a well defined wavelength range around 977 nm, travels through isolator 53 and coupler 54 and is injected in second laser+grating module 62. Emission from second laser+grating module 62 is splitted by coupler 54, so that 80% of the emitted power is sent towards the power meter 59 and the spectrum analyzer 60. The remaining 20% of the emitted power from the second laser 55, sent by coupler 54 towards laser 50, is blocked by optical isolator 53. Optical isolator 53 also blocks emitted power from laser 50 back-reflected by coupler 54. In such way, the optical emission from first laser+grating module 61 is completely stable. On the other branch, injection coming from first laser+grating module 61 may affect the longitudinal mode oscillations in the cavity formed between the second laser 55 and the second grating 57, thereby causing instability in the optical emission of the second laser+grating module 62.

Figure 4:
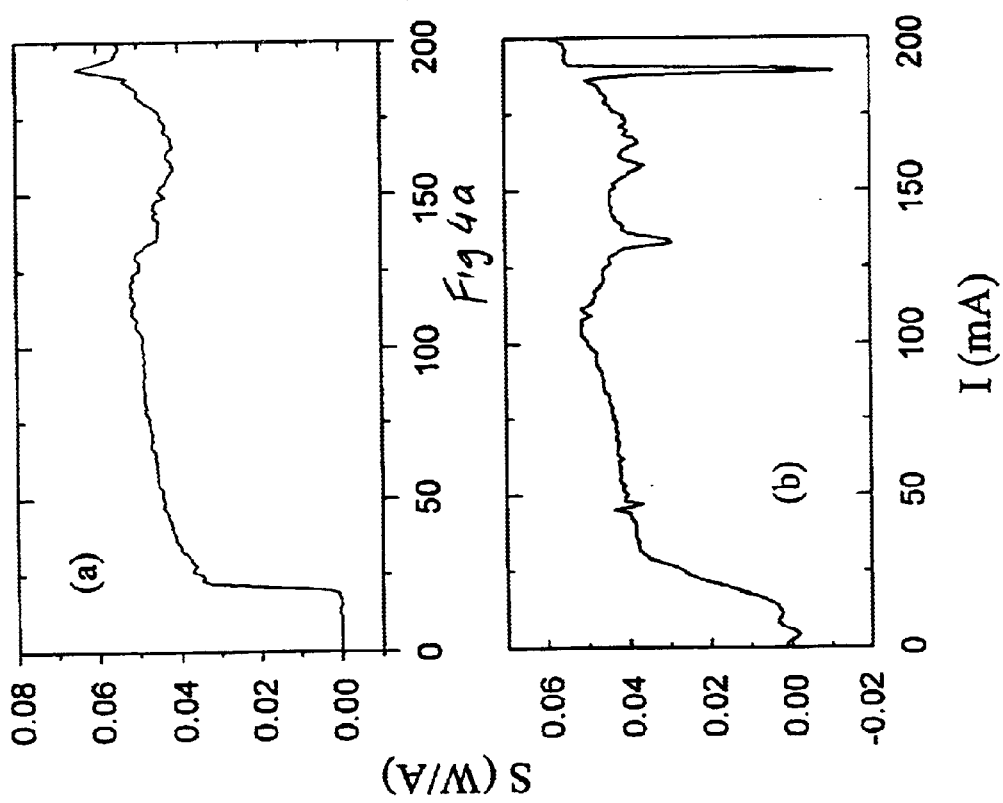
FIGS. 4a–4b show a plot of the slope of the P-I curve of an example of a grating-stabilized pump laser, respectively in case of no external injection and in case of external injection.

FIG. 4 shows the results of some measurements made with the setup of FIG. 3. In particular, FIG. 4 shows a comparison between the slope of the power per driving current (P-I) curve of the second laser+grating module 62 respectively when the first laser 50 is switched off (FIG. 4a) and when the first laser 50 is switched on (FIG. 4b): in particular, FIG. 4b shows the slope of the P-I curve of the second laser+grating module 62 when it is reached by an injected power of 5 mW. The slope of the P-I curve is plotted versus the pumping current I applied to the second laser 55. As it can be seen in FIG. 4a, when the first laser 50 is switched off, that is, when no injected power reaches the second laser 55, small oscillations are present in the curve around a mean value of the slope of the P-I curve of about 0.04 W/A. When the first laser 50 is switched on (FIG. 4b), nonlinearities appear in the P-I curve in correspondence of high current values (about 130 mA and 180 mA). In particular, negative slope values are reached, which were not present in the curve of FIG. 4a. Such nonlinearity of the P-I curve, represented by the abrupt negative spike shown in FIG. 4b, is generally indicated in the art with the term "kink". Kinks in the P-I curve should be avoided in a laser, and in particular in a laser for pumping optical amplifiers, since the emitted power decreases for increasing applied current, with a corresponding instability in the amplifier control loop.

Figure 5:
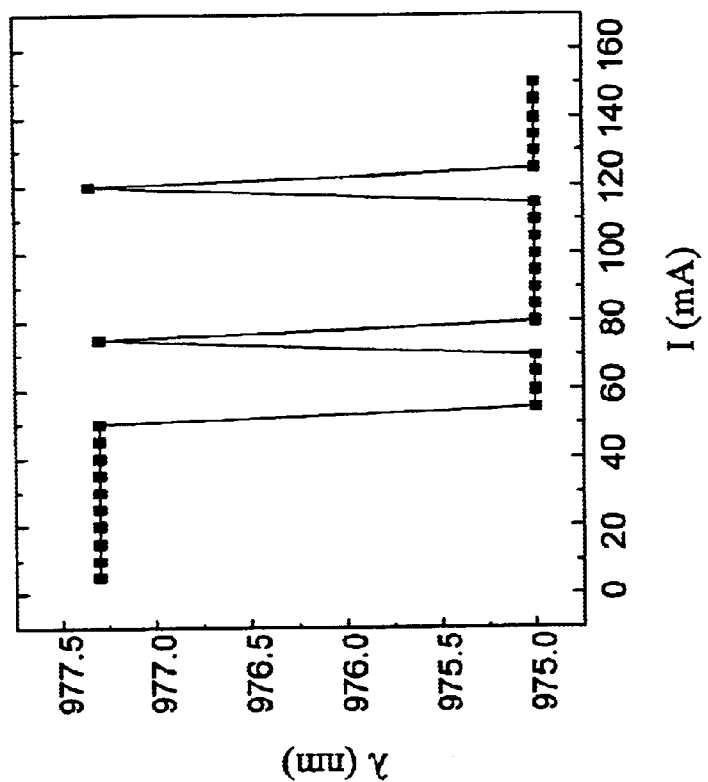
FIG. 5 shows a plot of the wavelength versus current of the grating-stabilized laser externally injected in the same conditions of FIG. 4b.

FIG. 5 shows the corresponding plot of the emitted wavelength of the second laser+grating module 62, in the same conditions described for FIG. 4b: as it can be seen, as long as the current is below about 50 mA, the emitted wavelength is centered around a value of 977 nm (that is the wavelength of the stabilizing grating 52 of the first laser 50), whereas for greater current values the emitted power is mainly confined around a wavelength value of 975 nm (that is the wavelength of the stabilizing grating 57 of the second laser 55), but oscillations are still present for current values around 75 mA and 120 mA.

Applicant has found that the instability of the optical emission of a laser+grating module injected by an external radiation may be avoided if the output power of the injected laser is maintained sufficiently higher than the injected power. In particular, Applicant has found that for any difference in wavelength between the injection and the emission of the injected laser+grating module (that is, the center wavelength of the grating), it is possible to find a ratio between the output power of the laser+grating module and the injected power which allows stability of the optical emission of the injected laser+grating module.

The stability of the optical emission of the second laser+grating module 62 may be evaluated by calculating the normalized power in band (PIB) around the center wavelength $\lambda_2$ of the stabilizing grating 57. PIB is the following function $$PIB = \frac{\int_{\lambda_2-1nm}^{\lambda_2+1nm} P(\lambda)d\lambda}{\int_{-\infty}^{+\infty} P(\lambda)d\lambda}$$

For a laser module stabilized for emitting a radiation of wavelength $\lambda_2$, the above function PIB is the ratio of the power emitted by the laser module in a wavelength range of two nm centered on the wavelength $\lambda_2$, versus the total power emitted in practice, a PIB of 0.8 or more is sufficient to say that the laser operates in optically stable regime around the wavelength value $\lambda_2$. The stable regime should be ensured for any operative condition of the laser.

If the grating-stabilized pump laser emits at a wavelength $\lambda_2$ in the 980 nm window and is injected by an external radiation having wavelength $\lambda_1$, also belonging to the 980 nm window, Applicant has found that a stable optical emission of the laser (that is, the PIB of the laser around $\lambda_2$ is higher than 0.8) can be achieved if the output power $P_F$ of the wavelength-stabilized laser itself is at least two times higher than the injected power $P_{inj}$.

Preferably, the ratio $P_F/P_{inj}$ should be kept higher than five, more preferably higher than ten, even more preferably higher than twenty.

In particular, an appropriate ratio $P_F/P_{inj}$ may be set in each practical case according to the difference $\Delta\lambda$ between the wavelength $\lambda_2$ emitted by the injected laser+grating module and the wavelength $\lambda_1$ of the injection. In order to remain in the 980 nm window, $\lambda_1$ and $\lambda_2$ have to be in a range between about 971 nm and 986 nm. Preferably, $|\Delta\lambda|$ should be higher than about 5 nm, more preferably higher than about 7 nm. The higher $|\Delta\lambda|$, the lower the ratio $P_F/P_{inj}$ that ensures stability.

By a series of simulations, Applicant has seen that the active material gain curve of the injected laser has an influence in determining stable emission conditions of the same. In particular, it has been found that the flatter is the gain curve of the injected laser, the higher is the ratio $P_F/P_{inj}$ that ensures stability. Flatness of the gain curve may be defined by measuring the difference in gain $\Delta g$ between the emitted wavelength $\lambda_2$ and the injected wavelength $\lambda_1$, that is, $\Delta g=g(\lambda_2)-g(\lambda_1)$. In practice, a value of $\Delta g$ approaching zero is the result of a relatively flat gain curve. In order to have a more stable configuration, the gain of the emitted wavelength $g(\lambda_2)$ should be preferably higher than the gain of the injected wavelength $g(\lambda_1)$, that is $\Delta g>0$ cm$^{-1}$. More preferably, $\lambda_1$ and $\lambda_2$ should be chosen so that $\Delta g>3$ cm$^{-1}$, even more preferably so as to obtain $\Delta g>5$ cm$^{-1}$.

Figure 6:
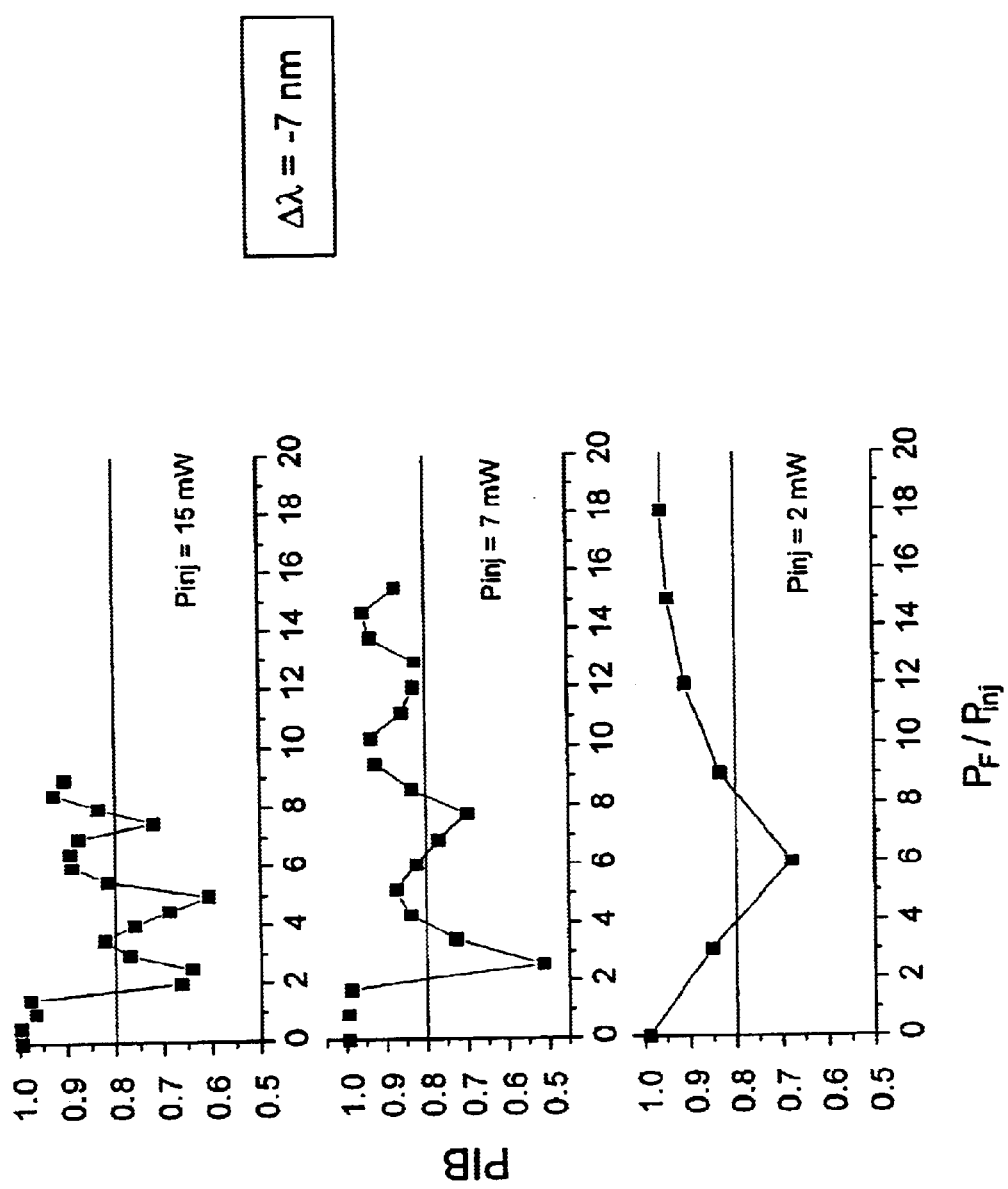
FIGS. 6 to 8 show some plots of the power-in-band (PIB) of an externally injected laser, obtained with the experimental setup of FIG. 3 with different injected powers and different detuning $\Delta\lambda$ between the gratings 52, 57.
Figure 7:
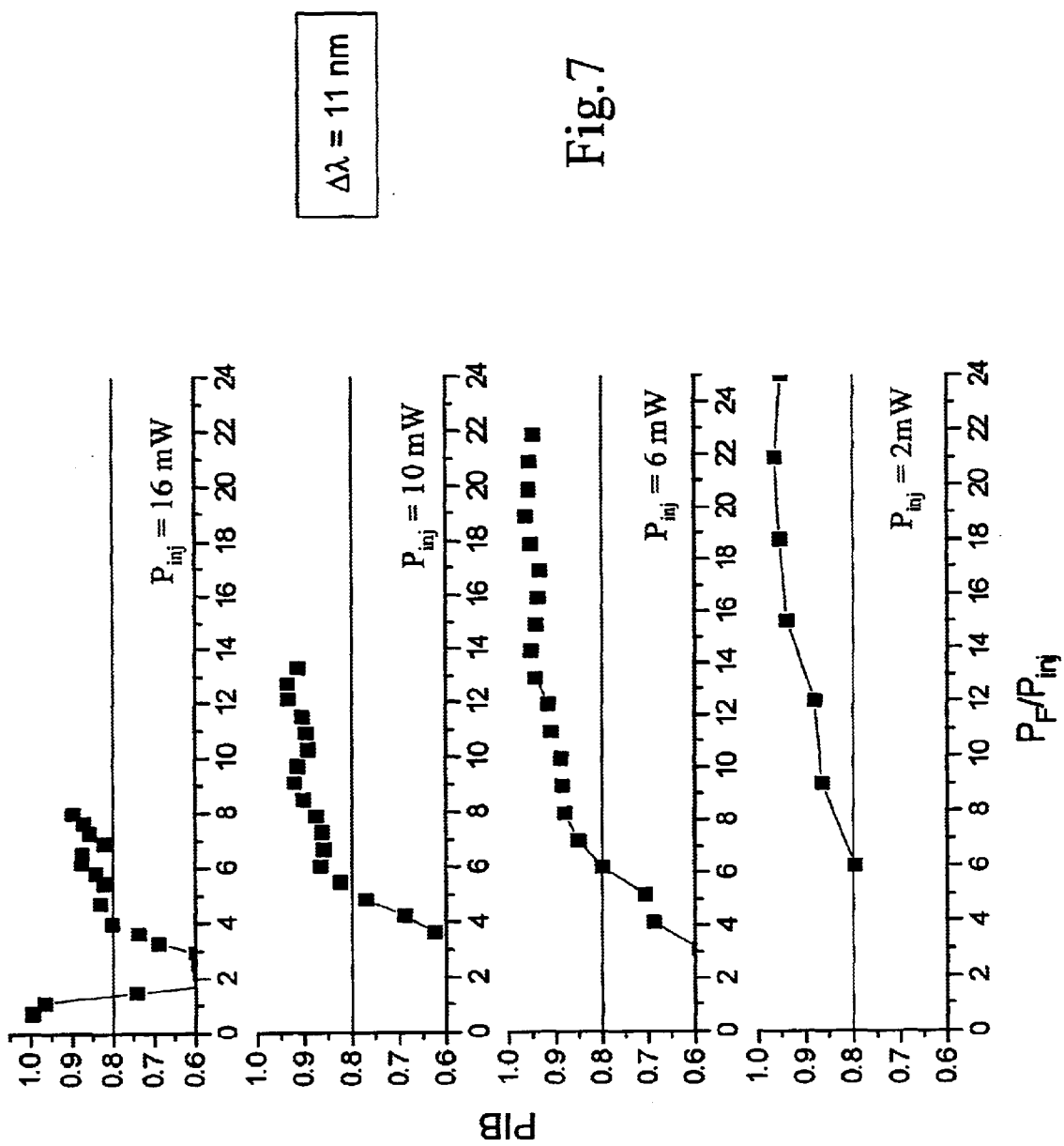
Figure 8:
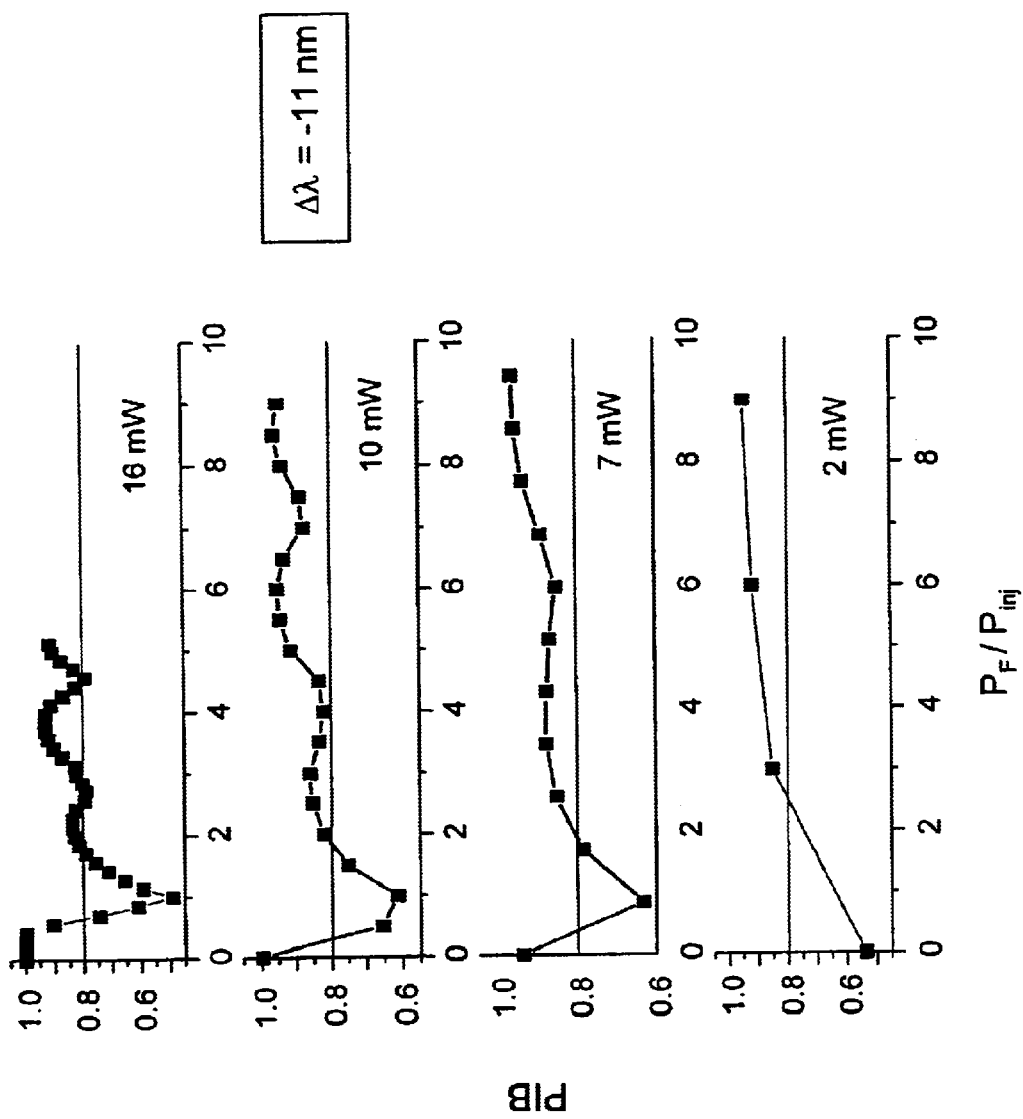

By using the experimental setup above described with reference to FIG. 3, Applicant has evaluated the PIB behaviour of the laser+grating module 62 in different conditions of external injection. FIGS. 6 to 8 resume the results of a series of experiments thereon. In FIGS. 6 to 8, the notation $P_F$ indicates the output power of the injected laser 203 and the notation $P_{inj}$ indicates the injected power.

FIG. 6 collects three plots of the PIB versus the ratio $P_F/P_{inj}$, corresponding to an injected power of 2 mW, 7 mW and 15 mW, respectively. In the experiment, carried out with the setup of FIG. 3, the center wavelength $\lambda_1$ of the first grating 52 was 982 nm and the center wavelength $\lambda_2$ of the second grating 57 was 975 nm ($\Delta\lambda=-7$ nm). As it can be seen from FIG. 6, a ratio $P_F/P_{inj}$ greater than about 9 is sufficient to ensure stability of the optical emission of the injected laser+grating module 62, that is, a PIB greater than 0.8.

FIG. 7 collects four plots of the PIB versus the ratio $P_F/P_{inj}$, corresponding to an injected power of 2 mW, 6 mW, 10 mW, 16 mW, respectively. In the experiment, the center wavelength $\lambda_1$ of the first grating 52 was 971 nm and the center wavelength $\lambda_2$ of the second grating 57 was 982 nm ($\Delta\lambda=11$ nm). As it can be seen from FIG. 7, a ratio $P_F/P_{inj}$ greater than about 6 is sufficient to ensure stability of the optical emission of the injected laser+grating module 62.

FIG. 8 collects four plots of the PIB versus the ratio $P_F/P_{inj}$, corresponding to an injected power of 2 mW, 7 mW, 10 mW, 16 mW, respectively. In the experiment, the center wavelength $\lambda_1$ of the first grating 52 was 982 nm and the center wavelength $\lambda_2$ of the second grating 57 was 971 nm ($\Delta\lambda=-11$ nm). As it can be seen from FIG. 8, a ratio $P_F/P_{inj}$ greater than about 2 is sufficient to ensure stability of the optical emission of the injected laser+grating module 62.

Table 2 resumes he results of the experiments. In table 2, the difference between the emitted wavelength $\lambda_2$ of the injected laser+grating module and the wavelength $\lambda_1$ of the injection is indicated by $\Delta\lambda$. We will refer to this wavelength difference to as a "detuning" between the optical emission of the injected laser+grating module and the injection. Further, the ratio $P_F/P_{inj}$ which ensures stability of the optical emission of the injected laser+grating module is reported both as an adimensional number and in dB.

TABLE 2

| $\Delta\lambda$ (nm) | $P_F/P_{inj}$ | $P_F/P_{inj}$ (dB) |
|---|---|---|
| −11 | 2 | 3 |
| −7 | 9 | 9.5 |
| −2 | 25 | 14 |
| 11 | 6 | 7.8 |

Figure 9:
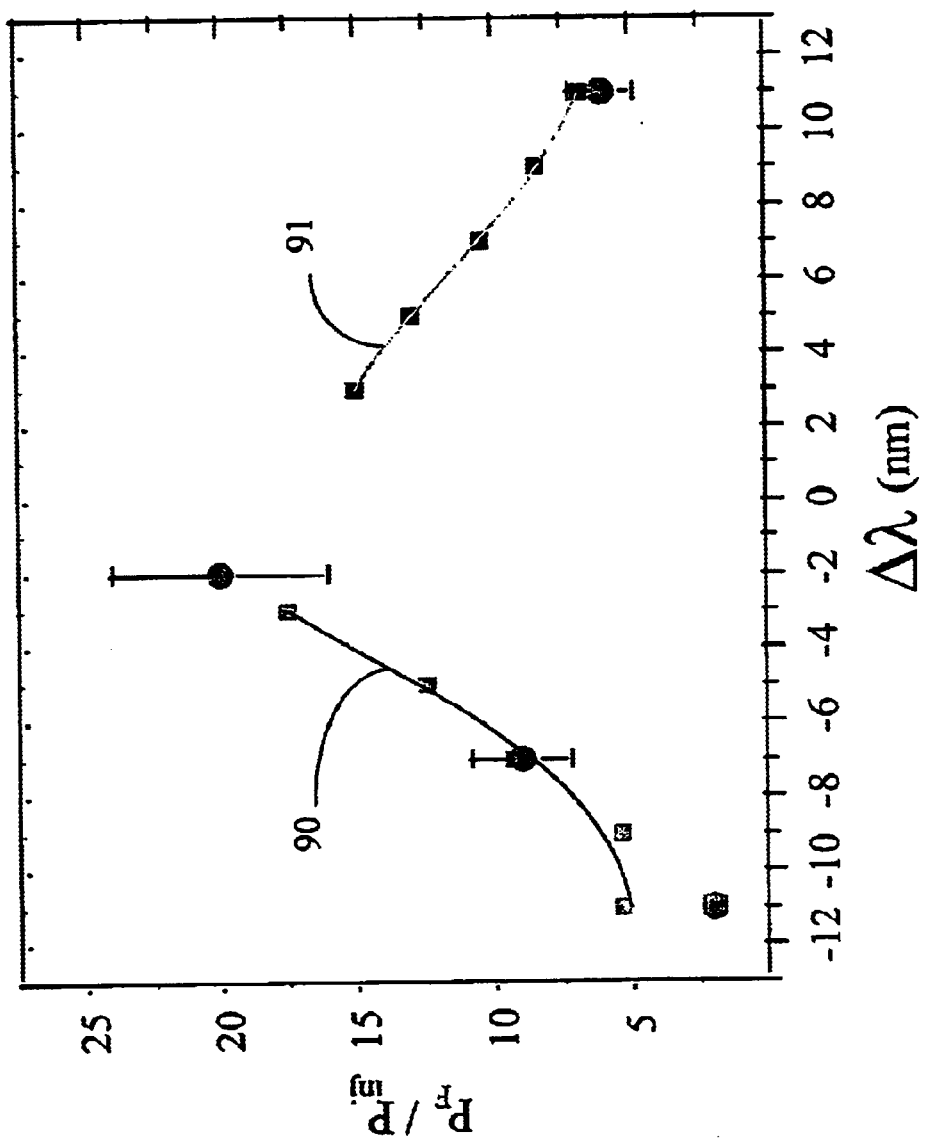
FIG. 9 shows the dependence of the ratio $P_F/P_{inj}$ with respect to the detuning $\Delta\lambda$.

A numerical simulation was also carried out for evaluating the stability conditions of the injected laser+grating module with respect to the detuning $\Delta\lambda$. The results of the numerical simulation is reported in FIG. 9, together with the experimental data (with corresponding error bars) above described with reference to FIGS. 6 to 8 and table 2. The results of the numerical simulation are referenced with squares, whereas the results of the experiments are referenced with dots. As it can be seen, a good agreement is reached between numerical and experimental data. When the ratio $P_F/P_{inj}$ is in a range higher than the values belonging to the two curves 90, 91 of FIG. 9, the optical emission of the injected laser is stable.

Figure 10:
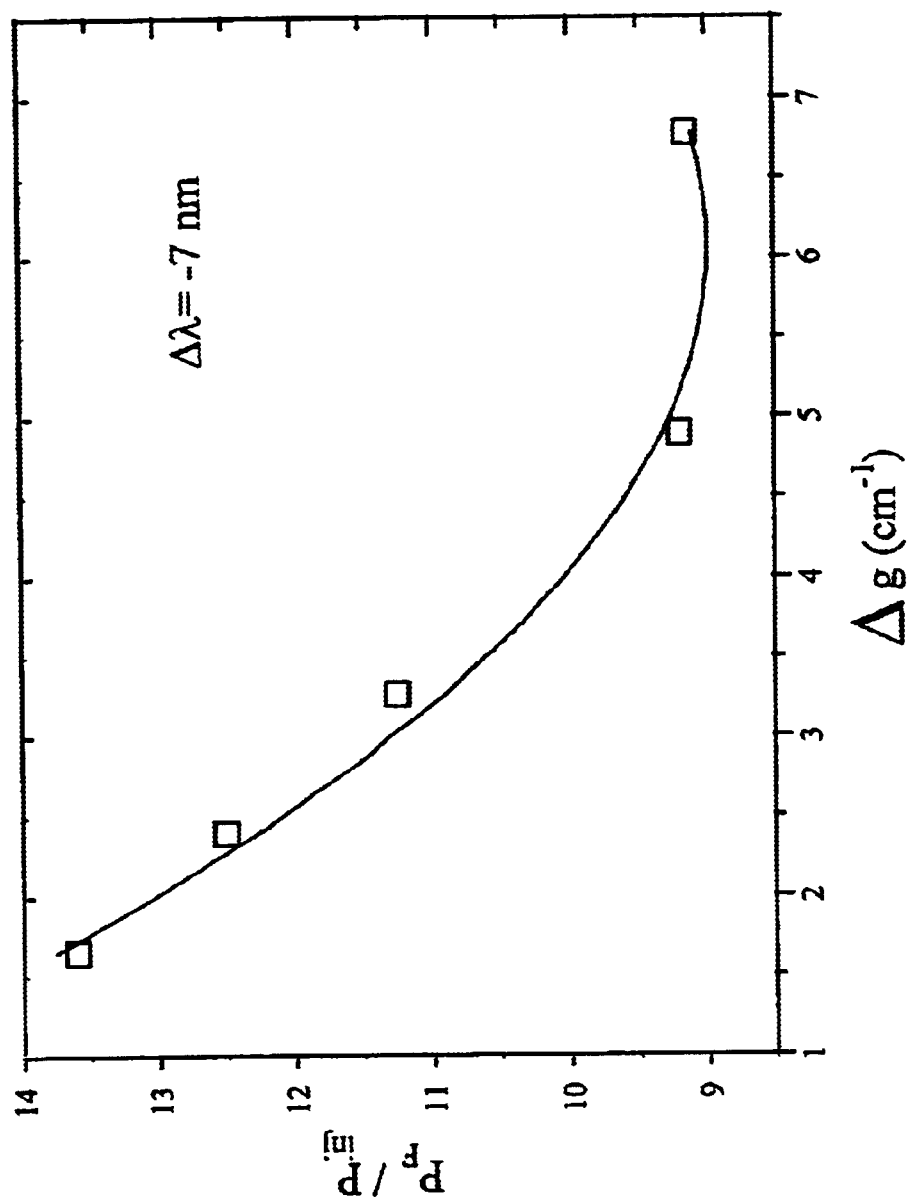
FIG. 10 shows the dependence of the ratio $P_F/P_{inj}$ with respect to the gain flatness $\Delta g$ of the injected laser.

FIG. 10 exemplarily shows the dependence of the ratio $P_F/P_{inj}$ with respect to the flatness of the gain curve of the injected laser. The curve of FIG. 10 was obtained by a simulation with different gain curves, in order to obtain the ratio $P_F/P_{inj}$ with a detuning $\Delta\lambda$ of −7 nm. As it can be seen, the flatter is the gain curve (that is, for lower values values of $\Delta g$), the higher the ratio $P_F/P_{inj}$ should be set.

Figure 11:
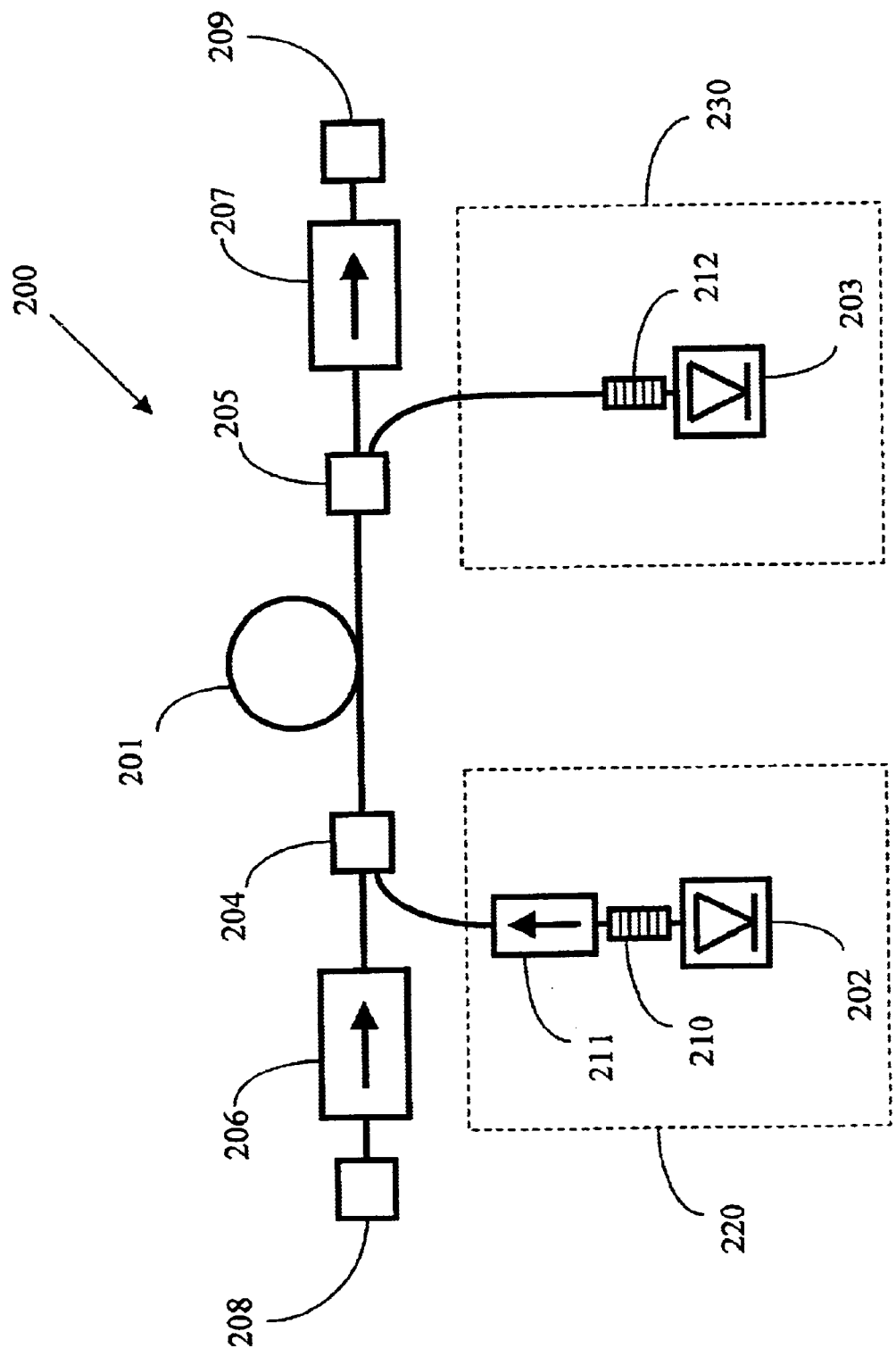
FIG. 11 schematically shows a preferred embodiment of a bidirectionally pumped optical amplifier according to the invention.

FIG. 11 schematically shows a preferred embodiment of a bidirectionally pumped optical amplifier 200, according to the invention. Optical amplifier 200 comprises an active fibre 201 and pump lasers 202, 203 comprised in pump branches 220, 230. WDM couplers 204, 205 are connected to the ends of the active fibre 201, for coupling in the active fibre 201 pump radiation coming from lasers 202, 203. Input and output terminals 208, 209 respectively allow the insertion of an optical signal to be amplified in the optical amplifier 200 and the dropping of the amplified optical signal from the optical amplifier 200. Active fibre 201 is typically an erbium doped fibre. Preferably, the absorption coefficient of the active fibre 201 is about 5 dB/m at 1550 nm. The length of the active fibre 201 is preferably higher than or equal to 10 m. Pump lasers 202, 203 preferably emit in the 980 nm window. Preferably, the power emitted by the pump lasers 202, 203 is higher than 15 mW, more preferably higher than 50 mW, even more preferably higher than 100 mW. Examples of pump lasers suitable to be used in optical amplifier 200 are AlGaAs-InGaAs based semiconductor lasers. At least one optical isolator for the optical signal is typically added in the optical amplifier 200 in the embodiment of FIG. 11, two optical isolators 206, 207 are present.

Pump radiation from lasers 202, 203 is inserted in the active fibre respectively in a co-propagating and counter-propagating direction. A first wavelength selective reflector 210 (in the following, for brevity, "selective reflector") is added in one of the pump branches 220 for stabilizing the emitted wavelength of the enclosed laser 202. A second selective reflector 212 is added in the other pump branch 230 for stabilizing the emitted wavelength of the enclosed laser 203. Selective reflectors 210, 212 have a low reflectivity, typically lower than about 10%, preferably lower than or equal to about 7%. Their bandwidth is typically lower than or equal to about 0.5 nm around a predetermined center wavelength. Preferably, selective reflectors 210, 212 are gratings, even more preferably fibre gratings. The distance $|\Delta\lambda|$ (detuning) between the center wavelengths of the selective reflectors 210, 212 is preferably lower or equal to about 15 nm.

One optical isolator 211 for the pump radiation is added in one of the two pump branches, for example branch 220 comprising the laser 202, that is the laser generating co-propagating pump light. Alternatively, the optical isolator may be added in the pump branch 230, comprising the laser 203, that is the laser generating counter-propagating pump light. In any case, one of the two pump branches 220, 230 has no isolator for the pump radiation.

A control system, as a feedback system, not shown in FIG. 11, is typically added in order to control the operative conditions of the amplifier 200. In particular, the control system can accurately set the output power of the pump lasers 202, 203 depending on the amplifier specifications. Typically, the feedback system comprises a coupler, for example a 99:1 coupler, after the output of the amplifier 200, that allows to extract from the line a small portion of the amplified signal light. Such portion of signal is measured by means of suitable devices, well known in the art, such as a photodetector and a control electronics, the latter being also connected to the pump laser 202, 203, for controlling the driving current thereof.

In operation, an optical signal is inserted in the optical amplifier 200 through input terminal 208, is amplified in the active fibre 201 and exits through output terminal 209. The optical signal may be, for example, a single channel or a plurality of channels traveling in a WDM system, of which optical amplifier 200 is a part.

Energy for optical amplification is provided by pump lasers 202, 203. Pump radiation from first laser 202 is coupled co-directionally in the active fibre 201 by means of first WDM coupler 204. Pump radiation from second laser 203 is coupled counter-directionally in the active fibre 201 by means of second WDM coupler 205.

A first pump residual coming from unabsorbed co-propagating pump radiation may reach the second WDM coupler 205 and be coupled towards the second pump laser 203. If the emitted power ($P_F$) by the second laser 203 and the power of the first pump residual ($P_{inj}$) are properly set, the optical emission of the second laser 203 is a stable optical emission, that is, the PIB of the laser 203 around the center wavelength of its stabilizing selective reflector 212 is higher than 0.8. The power of the first pump residual is related to the operative conditions of the optical amplifier 200: in particular, it is related to the output power of the first pump laser 202, to the power of the light signal(s) travelling in the amplifier, to the length of the active fibre 201.

A second pump residual coming from unabsorbed counter-propagating pump radiation may reach the first WDM coupler 204 and be coupled towards the first pump laser 202. This second pump residual is advantageously blocked by optical isolator 211, so that optical emission from first laser 202 is stable.

The setting of the appropriate ratio $P_F/P_{inj}$ for obtaining a stable emission from laser 203 is made according to the above. In particular, once the operative range of the optical amplifier 200 is known (that is, its output power), the ratio $P_F/P_{inj}$ is the result of a proper combination between the output powers of the lasers 202, 203, the length of the active fibre 201, the detuning $\Delta\lambda$ between the two selective reflectors 210, 212.

For example, if the output powers of the lasers are fixed in advance, one can derive the length of the active fibre 201 which can guarantee a pump residual power lower than that needed for obtaining a stable emission from the injected laser. In this respect, it has to be noticed that the absorption coefficient a of an active fibre at a pump wavelength is in general a known parameter. If the length of the active fibre 201 is fixed, one can choose a proper detuning between the selective reflectors 210, 212. As said, also the flatness of the gain curve of the injected laser can be taken into consideration.

The regulation of the powers of the pump lasers 202, 203 for ensuring the stable emission of the injected laser 203 can be made and checked by the feedback system of the optical amplifier 200. In this respect, it has to be noticed that the presence of the isolator 211 in one of the two pump branches 220, 230 allows to considerably simplify the feedback system. In fact, for keeping the ratio $P_F/P_{inj}$ sufficiently high, one can lower the power of the laser 202, that is the laser having the isolator 211, in order to keep $P_{inj}$ low, or enhance the output power $P_F$ of the injected laser 203, or both. In any case, if the isolator 211 were absent, these actions could eventually lead to instability of emission of the laser 202, due to pump residual injection. On the contrary, the presence of the isolator 211 allows to "decouple" the regulation of the powers in the pump branches 220, 230, since the second pump residual coming from laser 203 is not injected through laser 202.

Practically, the power $P_{inj}$ of the pump residual may be measured during the first setup of the optical amplifier 200, with no light signal travelling in the same, in order to keep the ratio $P_F/P_{inj}$ sufficiently high. The so determined $P_{inj}$ is actually a conservative value, since when a light signal travels through the doped fibre 201, to be amplified therein, pumped power is used for the amplification and the power of the pump residual lowers, so $P_F/P_{inj}$ is increased.

Examples of advantageous configurations of a bidirectionally pumped optical amplifier 200 comprising an active fibre (201) having an absorption coefficient of about 5 dB/m for wavelengths around 1550 nm are reported in the following table 3, in which: L represents the length of the active fibre 201, $P_1$ represents the output power of the wavelength-stabilized first laser 202, $P_2$ represents the output power of the wavelength-stabilized injected laser 203.

TABLE 3

| L (m) | $P_1$ (mW) | $\lambda_1$ (nm) | $P_2$ (mW) | $\lambda_2$ (nm) | $P_{inj}$ (mW) |
|---|---|---|---|---|---|
| 15 | 130 | 975 | 160 | 982 | 0.4 |
| 10 | 130 | 975 | 160 | 982 | 6.0 |
| 10 | 85 | 975 | 75 | 982 | 3.6 |

Figure 12:
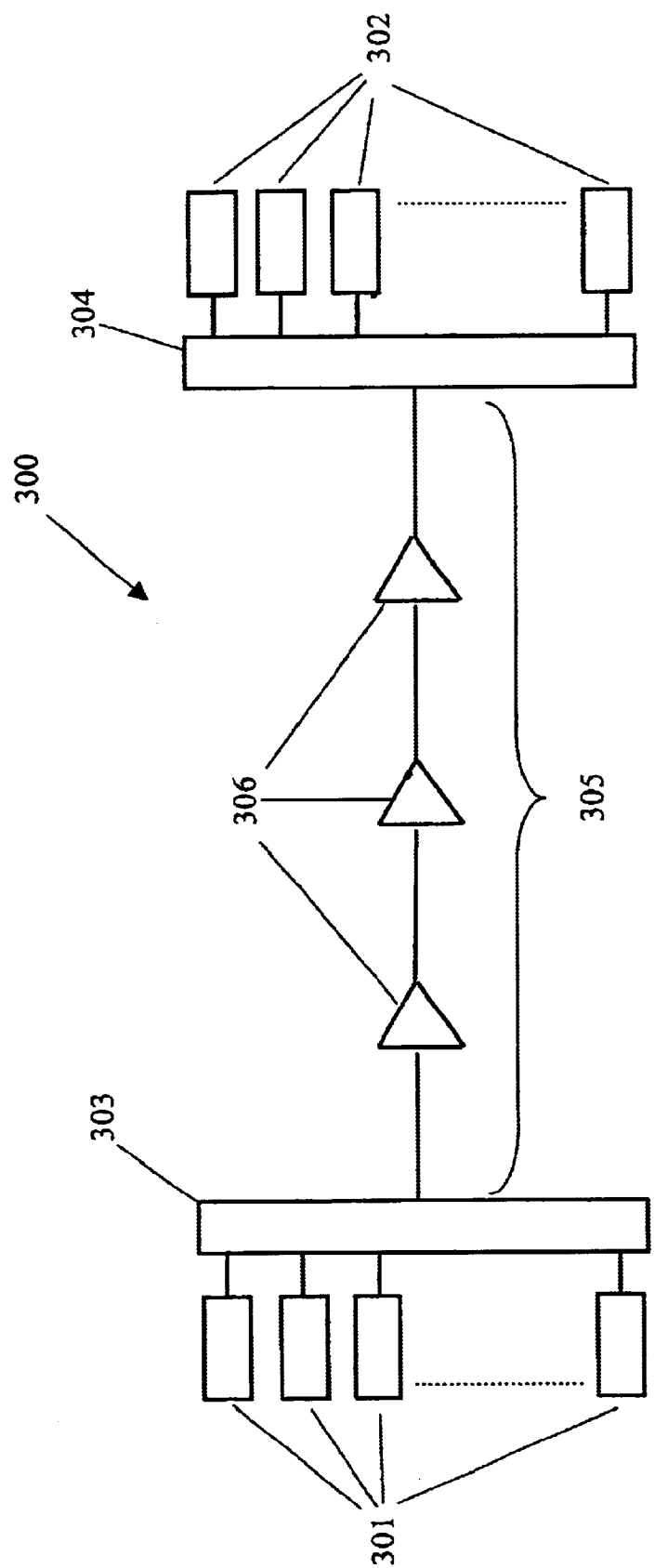
FIG. 12 schematically shows an optical WDM transmission system comprising a bidirectionally pumped optical amplifier according to the invention.

A bidirectionally pumped optical amplifier 200 as shown in FIG. 11 can be advantageously used in an optical transmission system, comprising at least one transmitter for emitting an optical signal, an optical transmission path, including at least one bidirectionally pumped optical amplifier according to the invention, and at least one receiver of said optical signal. In a typical configuration, schematically shown in FIG. 12, the optical transmission system is a WDM transmission sistem 300 comprising a plurality of transmitters 301, a plurality of receivers 302, a wavelength combiner 303, a wavelength demultiplexer 304, and an optical transmission path 305. The WDM system 300 also encloses one or more optical amplifier(s) 306 coupled along the optical transmission path 305. At least one optical amplifier 306 comprises a bidirectionally pumped optical amplifier according to the invention. The transmitters 301 are adapted for emitting optical signals at a different wavelengths. The signals are coupled by the combiner 303 along the optical transmission path 305, amplified by the optical amplifier(s) 306, separated by the demultiplexer 304 according to their wavelength and sent each to a respective receiver 302. Typically, the wavelength of the signals is comprised between 1520 and 1620 nm.

In particular, a bidirectionally pumped optical amplifier according to the invention can be advantageously used as a booster section 12 of an optical amplifier 10 as shown in FIG. 2, in an optical transmission system. In particular, it can be used for boosting WDM channels in a WDM optical transmission system.

Although the described examples were specifically referred to a laser emission wavelength range around 980 nm, Applicant believes that the features of the invention above described may be applied to other laser emission wavelength ranges, as for example around 1480 nm.

What is claimed is:

1. A bidirectionally pumped optical amplifier (200) comprising:
    an active fibre (201) having two ends,
    a first WDM coupler (204) and a second WDM coupler (205) coupled to said ends,
    a first pump branch (220) coupled to said first WDM coupler (204) comprising a first laser (202) and a first selective reflector (210), for introducing pump radiation into said active fibre (201) in a first direction,
    a second pump branch (230) coupled to said second WDM coupler (205) comprising a second laser (203) and a second selective reflector (212), for introducing pump radiation into said active fibre (201) in a second direction, opposite to said first direction, said second laser being adapted for emitting an output power $P_F$,
    the amplifier being adapted for coupling a pump residual, having a power $P_{inj}$,
    from said active fibre (201) into said second laser (203), characterized in that $P_F/P_{inj}>2$, and
    said first pump branch (220) further comprises an optical isolator (211) for the pump radiation.

2. An amplifier according to claim 1, characterized in that $P_F/P_{inj}>5$.

3. An amplifier according to claim 2, characterized in that $P_F/P_{inj}>10$.

4. An amplifier according to claim 1, said first selective reflector having a center wavelength $\lambda_1$, said second selective reflector having a center wavelength $\lambda_2$, characterized in that $|\lambda_2-\lambda_1|\leq 15$ nm.

5. An amplifier according to claim 4, characterized in that $|\lambda_2-\lambda_1|>5$ nm.

6. An amplifier according to claim 5, characterized in that $|\lambda_2-\lambda_1|>7$ nm.

7. An amplifier according to claim 4, said second laser having a gain curve $g(\lambda)$, characterized in that $g(\lambda_2)-g(\lambda_1)>0$ cm$^{-1}$.

8. An amplifier according to claim 7, characterized in that $g(\lambda_2)-g(\lambda)>3$ cm$^{-1}$.

9. An amplifier according to claim 4, characterized in that $\lambda_1$ and $\lambda_2$ are comprised in a range between 971 nm and 986 nm.

10. An optical amplifier (10) comprising:
    a pre-amplifying section (11), comprising at least one active fibre (111, 111') and
    at least one pump laser (113, 114), and
    a booster section (12), comprising a bidirectionally pumped optical amplifier according to claim 1.

11. An optical transmission system (300) comprising an optical transmission path (305), at least one transmitter (301) and at least one receiver (302), said at least one transmitter (301) and at least one receiver (302) being coupled to said optical transmission path (302), characterized in that it further comprises at least one optical amplifier (306) according to claim 1 coupled along said optical transmission path (305).

12. A method for pumping an optical amplifier (200) comprising an active fibre (201), a first pump laser (202) and a second pump laser (203), said method comprising:
    coupling a first wavelength-stabilized pump radiation from said first pump laser (202) to said active fibre in a first direction;
    coupling a second wavelength-stabilized pump radiation from said second pump laser (203) to said active fibre in a second direction, opposite to said first direction, said second pump radiation having a power $P_F$;
    coupling a pump residual in said first direction from said active fibre towards said second pump laser, said first pump residual having a power $P_{inj}$;
    characterized by further comprising
    maintaining a ratio $P_F/P_{inj}$ higher than two, and blocking a pump residual in said second direction from said active fibre before said first pump laser.

13. A method according to claim 12, characterized in maintaining said ratio $P_F/P_{inj}$ higher than five.

14. A method according to claim 12, said first wavelength-stabilized pump radiation having a wavelength $\lambda_1$, said second wavelength-stabilized pump radiation having a wavelength $\lambda_2$, characterized in that $|\lambda_2-\lambda_1|\leq 15$ nm.

15. A method according to claim 12, said second laser having a gain curve $g(\lambda)$, characterized in that $g(\lambda_2)-g(\lambda_1) > 0$ cm$^{-1}$.

16. A method according to claim 12, characterized in that $\lambda_1$ and $\lambda_2$ are comprised in a range between 971 nm and 986 nm.

17. A method for stabilizing the optical emission of a laser module injected by an external radiation having a wavelength $\lambda_1$, said laser module including a laser and a selective reflector, said laser having a gain curve $g(\lambda)$, characterized in that said method comprises choosing a center wavelength $\lambda_2$ of said selective reflector so that $g(\lambda_2)[\N]g(\lambda_1) > 0$ cm$^{-1}$, and maintaining a ratio between an output power $P_F$ of said laser module and a power $P_{inj}$ of said external radiation higher than two.

18. A method as in claim 17, characterized in that $|\lambda_2-\lambda_1| \leq 15$ nm.

19. A method according to claim 17, characterized by maintaining said ratio $P_F/P_{inj}$ higher than five.

20. A method according to claim 17, characterized in that $\lambda_1$ and $\lambda_2$ are comprised in a range between 971 nm and 986 nm.

* * * * *